(12) United States Patent
Kuang et al.

(10) Patent No.: US 12,362,555 B2
(45) Date of Patent: Jul. 15, 2025

(54) WATERPROOF DETECTION CIRCUIT AND BATTERY PACK

(71) Applicant: Shanghai Baicheng Electric Equipment Manufacture Co., Ltd., Shanghai (CN)

(72) Inventors: Guofang Kuang, Shanghai (CN); Huatian Luo, Shanghai (CN)

(73) Assignee: Shanghai Baicheng Electric Equipment Manufacture Co., Ltd., Shanghai (CN)

( * ) Notice: Subject to any disclaimer, the term of this patent is extended or adjusted under 35 U.S.C. 154(b) by 185 days.

(21) Appl. No.: 18/374,738

(22) Filed: Sep. 29, 2023

(65) Prior Publication Data
US 2024/0266822 A1  Aug. 8, 2024

(30) Foreign Application Priority Data
Feb. 7, 2023 (CN) .......................... 202320145063.0

(51) Int. Cl.
*H02H 7/18* (2006.01)
*G01R 31/389* (2019.01)

(52) U.S. Cl.
CPC ............. *H02H 7/18* (2013.01); *G01R 31/389* (2019.01)

(58) Field of Classification Search
CPC ........ G01R 31/389; H02H 5/083; H02H 7/18; Y02E 60/10
USPC ........................................................... 361/78
See application file for complete search history.

(56) References Cited

U.S. PATENT DOCUMENTS

| | | | |
|---|---|---|---|
| 2022/0189718 A1* | 6/2022 | Uy .................. | E04H 4/1654 |
| 2022/0359920 A1* | 11/2022 | Omagari ............... | H01M 10/44 |

FOREIGN PATENT DOCUMENTS

| | | | | |
|---|---|---|---|---|
| CN | 1571277 A | * | 1/2005 | |
| CN | 202678945 U | * | 1/2013 | |
| CN | 108366146 A | * | 8/2018 | ............ H04M 1/026 |
| KR | 2007096452 A | * | 10/2007 | ........ H01M 10/4257 |
| KR | 20070096452 A | | 10/2007 | |

OTHER PUBLICATIONS

Machine translation of Lee Korean Patent Document KR 2007-0096452 A Oct. 2007 (Year: 2007).*
Machine translation of Zhang Chinese Patent Document CN 1571277 A Jan. 2005 (Year: 2005).*

(Continued)

*Primary Examiner* — Kevin J Comber
(74) *Attorney, Agent, or Firm* — CM Law; Stephen J. Weed

(57) ABSTRACT

Provided are a waterproof detection circuit and a battery pack. The waterproof detection circuit is applied to a battery pack and includes a waterproof detection terminal, a waterproof detection module, and a switch module. A positive terminal of the battery pack is connected to a first terminal of a microcontroller of the battery pack. A negative terminal of the battery pack is connected to a second terminal of the microcontroller of the battery pack. The microcontroller of the battery pack is activated and controls the switch module to be conducted in response to an impedance change of the positive terminal of the battery pack and the negative terminal of the battery pack.

17 Claims, 4 Drawing Sheets

(56) References Cited

OTHER PUBLICATIONS

Machine translation of Huang Chinese Patent Document CN 202678945 U Jan. 2013 (Year: 2013).*
Machine translation of Cao Chinese Patent Document CN 108366146 A Aug. 2018 (Year: 2018).*
Extended European Search Report for European Application No. 23195707.7, dated Mar. 12, 2024—7 pages.

* cited by examiner

WATERPROOF DETECTION CIRCUIT AND BATTERY PACK

CROSS-REFERENCE TO RELATED APPLICATION

This application claims priority to Chinese Patent Application No. 202320145063.0 filed Feb. 7, 2023, the disclosure of which is incorporated herein by reference in its entirety.

TECHNICAL FIELD

Embodiments of the present utility model relate to the technical field of battery waterproof detection, in particular, a waterproof detection circuit and a battery pack.

BACKGROUND

In existing battery packs, a battery management system has a discharge MOS. However, when falling into water, a battery pack is activated because water is generally not completely pure, and a certain resistance exists. After the battery pack is activated, the discharge MOS is turned on so that an output terminal has a voltage output. The voltage leaks through the resistance of the water, or electrolysis is generated. Electrolytic corrosion occurs on part of an output contact terminal, a contact cable, and a quick contact terminal of the battery pack. Over time, the body housing, terminal interface, and other components of the battery pack are damaged, resulting in hidden risks in the quality of the battery pack. Existing lithium battery packs are not waterproof, especially some lithium battery packs with a high number of strings. Therefore, if a lithium battery pack is dropped into saline-alkali water, electrolysis easily occurs, corroding the battery pack and even causing deflagration. In related art, an existing problem is as follows: only detection is possible, but waterproof protection cannot be carried out.

SUMMARY

The present utility model provides a waterproof detection circuit and a battery pack for waterproof protection of the battery pack.

According to an aspect of the present utility model, a waterproof detection circuit is provided. The waterproof detection circuit is applied to a battery pack and includes a waterproof detection terminal, a waterproof detection module, and a switch module.

A detection terminal of a microcontroller of the battery pack is connected to a first terminal of the waterproof detection module. A second terminal of the waterproof detection module is connected to a first terminal of the switch module. A control terminal of the microcontroller of the battery pack is connected to a second terminal of the switch module. A third terminal of the switch module is connected to the waterproof detection terminal.

A positive terminal of the battery pack is connected to a first terminal of the microcontroller of the battery pack. A negative terminal of the battery pack is connected to a second terminal of the microcontroller of the battery pack. The microcontroller of the battery pack is activated and controls the switch module to be conducted in response to an impedance change of the positive terminal of the battery pack and the negative terminal of the battery pack.

The microcontroller of the battery pack is used for controlling the switch module, a charge MOS of the battery pack, and a discharge MOS of the battery pack to be turned off when the positive terminal of the battery pack and the waterproof detection terminal satisfy a preset condition.

Optionally, the preset condition includes at least one of voltage, current, or resistance variation.

Optionally, the waterproof detection module includes a first current limiting unit, a second current limiting unit, a filtering unit, and a voltage stabilizing unit.

A first terminal of the first current limiting unit is used as the first terminal of the waterproof detection module. A second terminal of the first current limiting unit is connected to a first terminal of the second current limiting unit. A first terminal of the filtering unit is connected to the first terminal of the first current limiting unit. A second terminal of the filtering unit is connected to a second terminal of the second current limiting unit and then grounded. A first terminal of the voltage stabilizing unit is connected to the first terminal of the second current limiting unit. A second terminal of the voltage stabilizing unit is connected to the second terminal of the second current limiting unit and then grounded. The first terminal of the voltage stabilizing unit is used as the second terminal of the waterproof detection module.

Optionally, the first current limiting unit includes a first resistor; a first terminal of the first resistor is used as the first terminal of the waterproof detection module; the second current limiting unit includes a second resistor; a second terminal of the second resistor is grounded; a second terminal of the first resistor is connected to a first terminal of the second resistor.

Optionally, the filtering unit includes a first capacitor; a first terminal of the first capacitor is connected to the first terminal of the first current limiting unit; a second terminal of the first capacitor is connected to the second terminal of the second current limiting unit; the voltage stabilizing unit includes a first diode connected between the first terminal of the second current limiting unit and the second terminal of the second current limiting unit.

Optionally, the switch module includes a switch transistor, a first voltage dividing unit, and a second voltage dividing unit.

A first electrode of the switch transistor is used as the first terminal of the switch module. A control terminal of the switch transistor is connected to a first terminal of the first voltage dividing unit. A second terminal of the first voltage dividing unit is used as the second terminal of the switch module. A second electrode of the switch transistor is connected to a first terminal of the second voltage dividing unit. A second terminal of the second voltage dividing unit is used as the third terminal of the switch module.

Optionally, the first voltage dividing unit includes a third resistor; a first terminal of the third resistor is connected to the control terminal of the switch transistor; a second terminal of the third resistor is used as the second terminal of the switch module; the second voltage dividing unit includes a fourth resistor; a second terminal of the fourth resistor is used as the third terminal of the switch module and connected to the waterproof detection terminal; a first terminal of the fourth resistor is connected to the second electrode of the switch transistor.

Optionally, the switch transistor includes at least one of power devices of MOSFET, IGBT, SCR, SiC, or GaN.

According to another aspect of the present utility model, a battery pack is provided. The battery pack includes the waterproof detection circuit in any description of the preceding aspect, a positive terminal, a negative terminal, a microcontroller, a charge MOS, and a discharge MOS.

Optionally, the microcontroller includes at least one of a single-chip microcomputer, an MCU, or an FPGA.

Embodiments of the present utility model provide a waterproof detection circuit. The waterproof detection circuit is applied to a battery pack and includes a waterproof detection terminal, a waterproof detection module, and a switch module. In this technical solution, a microcontroller of the battery pack is activated and controls the switch module to be conducted in response to an impedance change of a positive terminal of the battery pack and a negative terminal of the battery pack. In this manner, the waterproof detection terminal and the waterproof detection module cooperate with the positive terminal of the battery pack to detect whether water exists outside the battery pack. The switch module, a charge MOS of the battery pack, and a discharge MOS of the battery pack are controlled to be turned off when water exists. Therefore, embodiments of the present utility model can protect the battery pack from water, and the presence of external water does not cause leakage of electricity during the charging of the battery pack or cause electrolysis of water at the positive and negative terminals of the battery pack. In summary, the technical solution in embodiments of the present utility model solves the problem that in related art, water can only be detected, and waterproof protection cannot be provided for the battery pack dropped into water.

It is to be understood that the contents described in this part are not intended to identify key or important features of embodiments of the present utility model and are not intended to limit the scope of the present utility model. Other features of the present utility model are apparent from the description provided hereinafter.

BRIEF DESCRIPTION OF DRAWINGS

To illustrate technical solutions in embodiments of the present utility model more clearly, accompanying drawings used in the description of the embodiments are briefly described below. Apparently, the accompanying drawings described below illustrate part of embodiments of the present utility model, and those of ordinary skill in the art may acquire other accompanying drawings based on the accompanying drawings described below on the premise that no creative work is done.

DETAILED DESCRIPTION

The technical solutions in embodiments of the present utility model are described clearly and completely in conjunction with drawings in the embodiments of the present utility model from which the solutions are better understood by those skilled in the art. Apparently, the embodiments described below are part, not all, of the embodiments of the present utility model. Based on the embodiments of the present utility model, all other embodiments obtained by those of ordinary skill in the art without creative work are within the scope of the present utility model.

It is to be noted that terms such as "first" and "second" in the description, claims, and drawings of the present utility model are used to distinguish between similar objects and are not necessarily used to describe a particular order or sequence. It should be understood that the data used in this manner are interchangeable where appropriate so that the embodiments of the present utility model described herein may also be implemented in a sequence not illustrated or described herein. In addition, terms "comprising", "including", and any other variations thereof are intended to encompass a non-exclusive inclusion. For example, a process, method, system, product, or device that includes a series of steps or units not only includes the expressly listed steps or units, but may also include other steps or units that are not expressly listed or are inherent to such a process, method, product, or device.

Figure 1:
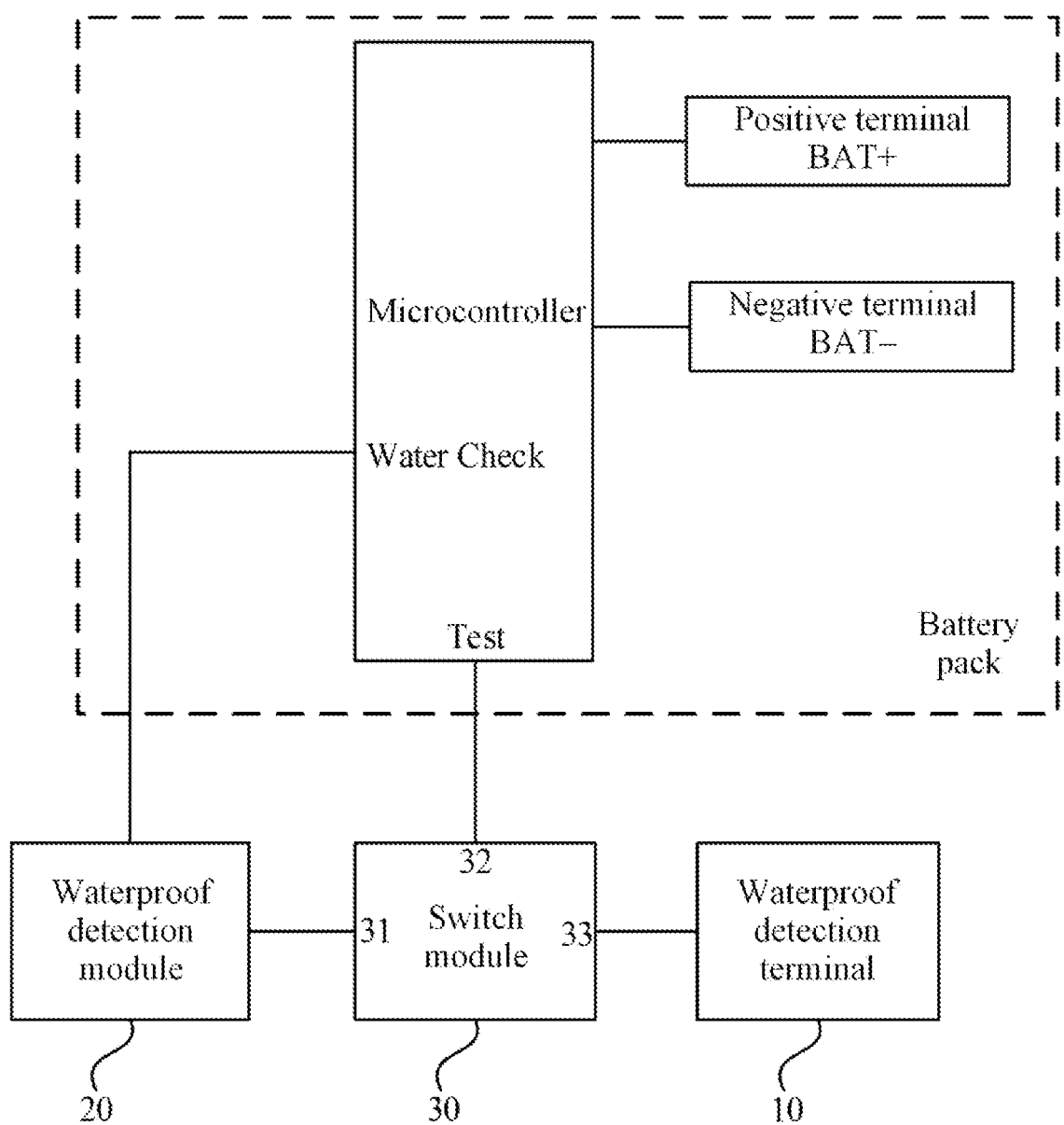
FIG. 1 is a schematic diagram illustrating the structure of a waterproof detection circuit according to an embodiment of the present utility model.

FIG. 1 is a schematic diagram illustrating the structure of a waterproof detection circuit according to an embodiment of the present utility model. Referring to FIG. 1, this embodiment of the present utility model provides a waterproof detection circuit. The waterproof detection circuit is applied to a battery pack and includes a waterproof detection terminal 10, a waterproof detection module 20, and a switch module 30. A detection terminal Water Check of a microcontroller of the battery pack is connected to a first terminal of the waterproof detection module 20. A second terminal of the waterproof detection module 20 is connected to a first terminal 31 of the switch module 30. A control terminal Test of the microcontroller of the battery pack is connected to a second terminal 32 of the switch module 30. A third terminal 33 of the switch module 30 is connected to the waterproof detection terminal 10. A positive terminal BAT+ of the battery pack is connected to a first terminal of the microcontroller of the battery pack. A negative terminal BAT− of the battery pack is connected to a second terminal of the microcontroller of the battery pack. The microcontroller of the battery pack is activated and controls the switch module 30 to be conducted in response to an impedance change of the positive terminal BAT+ of the battery pack and the negative terminal BAT− of the battery pack. The microcontroller of the battery pack is used for controlling the switch module 30, a charge MOS of the battery pack, and a discharge MOS of the battery pack to be turned off when the positive terminal BAT+ of the battery pack and the waterproof detection terminal 10 satisfy a preset condition.

Specifically, the waterproof detection circuit mainly includes a waterproof detection terminal 10, a waterproof detection module 20 connected inside, and a switch module 30 connected to the waterproof detection module 20 and the waterproof detection terminal 10. The waterproof detection terminal 10 extends to the outside via a plastic case. The battery pack is sealed so that water cannot enter the battery pack. The waterproof detection terminal 10, water, and a positive terminal BAT+ and a negative terminal BAT− of the battery pack constitute an independent detection circuit.

The battery pack may be a lithium battery pack. Normally, when the battery pack is not dropped into water, the battery pack is generally in a dormant state to save power. When the battery pack needs to be used, the positive terminal BAT+ and the negative terminal BAT− of the battery pack are connected to a load, and the battery pack is activated to provide power. When the battery pack is dropped into water, and the positive terminal BAT+ and the negative terminal BAT− of the battery pack contact liquid, a certain impedance is formed on the surface of the two terminals. When the impedance changes, the battery pack is activated; a microcontroller of the battery pack is awakened; the microcontroller of the battery pack controls a discharge MOS to be turned on; the switch module 30 is activated. When an impedance exists between the waterproof detection terminal 10 and the positive terminal BAT+ of the battery pack, the microcontroller of the battery pack turns off the discharge MOS and the charge MOS, and a common terminal (COM) sub-circuit of the battery pack is disconnected. In this case, the water-fed battery pack cannot be charged when connected to a charger, avoiding an electric leakage accident. The common terminal (COM) is a communication terminal between the battery pack and the charger for transmitting all signals of the battery pack, for example, a cell voltage signal and a temperature signal. Additionally, when the battery pack is dropped into water, the microcontroller of the battery pack is activated when the impedance of the positive terminal of the battery pack and the negative terminal of the battery pack changes, which is beneficial to saving the power in the battery pack and avoiding excessive discharge.

Specifically, the process of waterproof detection is as follows: When the battery pack is dropped into water, the microcontroller of the battery pack is activated. First, the microcontroller of the battery pack turns on the switch module 30 to connect the waterproof detection module 20 to the waterproof detection terminal 10. The impedance of the positive terminal BAT+ of the battery pack and the surface of the waterproof detection terminal 10 changes, and the waterproof detection terminal 10 sends a collected signal to the microcontroller of the battery pack via the switch module 30 and the waterproof detection module 20. The microcontroller of the battery pack compares the received signal with a signal in an internally-stored preset condition to determine whether water exists outside the battery pack. When water exists, the microcontroller of the battery pack controls the discharge MOS of the battery pack to be turned off or the charge MOS to be turned off so as to avoid an electric leakage accident when the battery pack is charged with a charger or electrolysis of water at the positive terminal BAT+ and the negative terminal BAT− of the battery pack when the battery pack is discharged.

If it is detected that water exists outside, the switch module 30 disconnects the waterproof detection module 20 and the waterproof detection terminal 10. Therefore, the battery pack does not leak electricity or electrolyze water due to outside water. When the battery pack is activated next time (that is, falls into water again), the switch module 30 is turned on again to communicate the waterproof detection module 20 with the waterproof detection terminal 10. When water is detected, the discharge MOS is not allowed to be turned on, and the connection of the waterproof detection module 20 to the waterproof detection terminal 10 is disconnected via the switch module 30. Therefore, the battery pack is thrown into water several times and protected each time.

Embodiments of the present utility model provide a waterproof detection circuit. The waterproof detection circuit is applied to a battery pack and includes a waterproof detection terminal, a waterproof detection module, and a switch module. In this technical solution, a microcontroller of the battery pack is activated and controls the switch module to be conducted in response to an impedance change of a positive terminal of the battery pack and a negative terminal of the battery pack. In this manner, the waterproof detection terminal and the waterproof detection module cooperate with the positive terminal of the battery pack to detect whether water exists outside the battery pack. The switch module, a charge MOS of the battery pack, and a discharge MOS of the battery pack are controlled to be turned off when water exists. Therefore, embodiments of the present utility model can protect the battery pack from water, and the presence of external water does not cause leakage of electricity during the charging of the battery pack or cause electrolysis of water at the positive and negative terminals of the battery pack. In summary, the technical solution in embodiments of the present utility model solves the problem that in related art, water can only be detected, and waterproof protection cannot be provided for the battery pack dropped into water.

With continued reference to FIG. 1, optionally, the preset condition includes at least one of voltage, current, or resistance variation.

Specifically, the impedance of the positive terminal BAT+ of the battery pack and the surface of the waterproof detection terminal 10 changes, and the waterproof detection terminal 10 sends collected voltage, current, and resistance variation signals to the microcontroller of the battery pack via the switch module 30 and the waterproof detection module 20. The microcontroller of the battery pack compares the received voltage, current, and resistance variation signals with a signal in an internally-stored preset condition to determine whether water exists outside the battery pack. When water exists, the microcontroller of the battery pack controls the discharge MOS of the battery pack to be turned off or the charge MOS to be turned off to avoid the battery pack dropped into water from being damaged.

Figure 2:
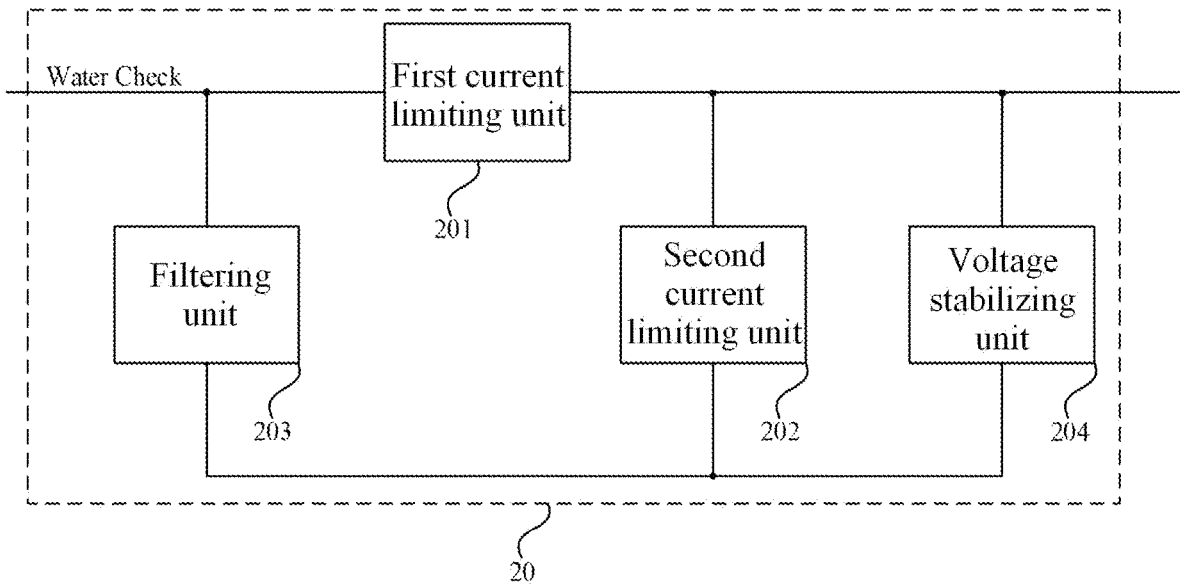
FIG. 2 is a schematic diagram illustrating the structure of another waterproof detection circuit according to an embodiment of the present utility model.

FIG. 2 is a schematic diagram illustrating the structure of another waterproof detection circuit according to an embodiment of the present utility model. With reference to FIG. 2, optionally, the waterproof detection module 20 includes a first current limiting unit 201, a second current limiting unit 202, a filtering unit 203, and a voltage stabilizing unit 204. A first terminal of the first current limiting unit 201 is used as the first terminal of the waterproof detection module 20. A second terminal of the first current limiting unit 201 is connected to a first terminal of the second current limiting unit 202. A first terminal of the filtering unit 203 is connected to the first terminal of the first current limiting unit 201. A second terminal of the filtering unit 203 is connected to a second terminal of the second current limiting unit 202 and then grounded. A first terminal of the voltage stabilizing unit 204 is connected to the first terminal of the second current limiting unit 202. A second terminal of the voltage stabilizing unit 204 is connected to the second terminal of the second current limiting unit 202 and then grounded. The first terminal of the voltage stabilizing unit 204 is used as the second terminal of the waterproof detection module 20.

Specifically, when the impedance of the positive terminal of the waterproof detection terminal battery pack and the surface of the waterproof detection terminal changes, the waterproof detection terminal sends a collected signal to the microcontroller of the battery pack via the switch module, the voltage stabilizing unit 204, the second current limiting unit 202, the first current limiting unit 201, and the filtering unit 203 in the waterproof detection module 20. The microcontroller of the battery pack compares the received signal with a signal in an internally-stored preset condition to determine whether water exists outside the battery pack.

When water exists, the microcontroller of the battery pack controls the discharge MOS of the battery pack to be turned off or the charge MOS to be turned off.

Figure 3:
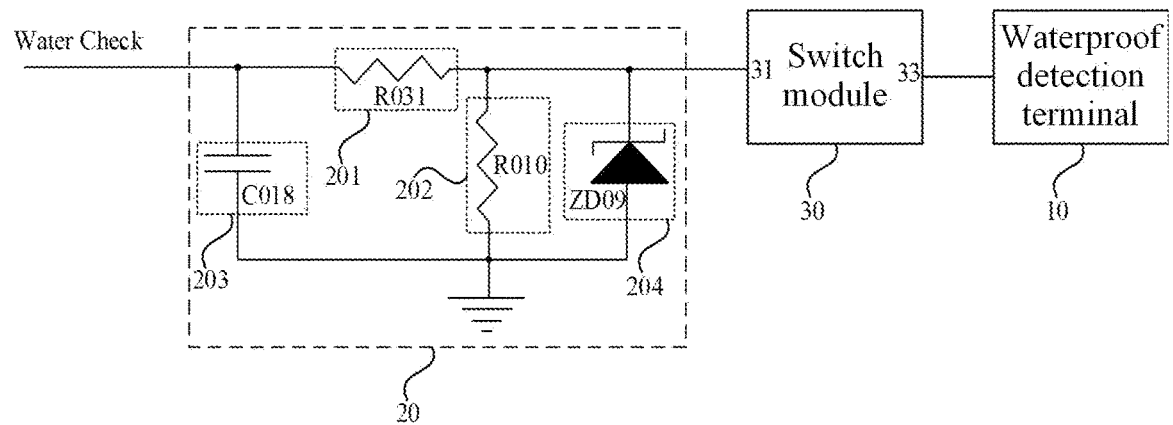
FIG. 3 is a schematic diagram illustrating the structure of another waterproof detection circuit according to an embodiment of the present utility model.

FIG. 3 is a schematic diagram illustrating the structure of another waterproof detection circuit according to an embodiment of the present utility model. With reference to FIG. 3, optionally, the first current limiting unit 201 includes a first resistor R031, and a first terminal of the first resistor R031 is used as the first terminal of the waterproof detection module 20; the second current limiting unit 202 includes a second resistor R010, a second terminal of the second resistor R010 is grounded, and a second terminal of the first resistor R031 is connected to a first terminal of the second resistor R010.

With continued reference to FIG. 3, optionally, the filtering unit 203 includes a first capacitor C018, a first terminal of the first capacitor C018 is connected to the first terminal of the first current limiting unit 201, and a second terminal of the first capacitor C018 is connected to the second terminal of the second current limiting unit 202; the voltage stabilizing unit 204 includes a first diode ZD09 connected between the first terminal of the second current limiting unit 202 and the second terminal of the second current limiting unit 202.

Specifically, the first resistor R031 and the second resistor R010 are mainly used for current limiting. The first capacitor C018 is mainly used for filtering. The first diode ZD09 is mainly used for protection.

Figure 4:
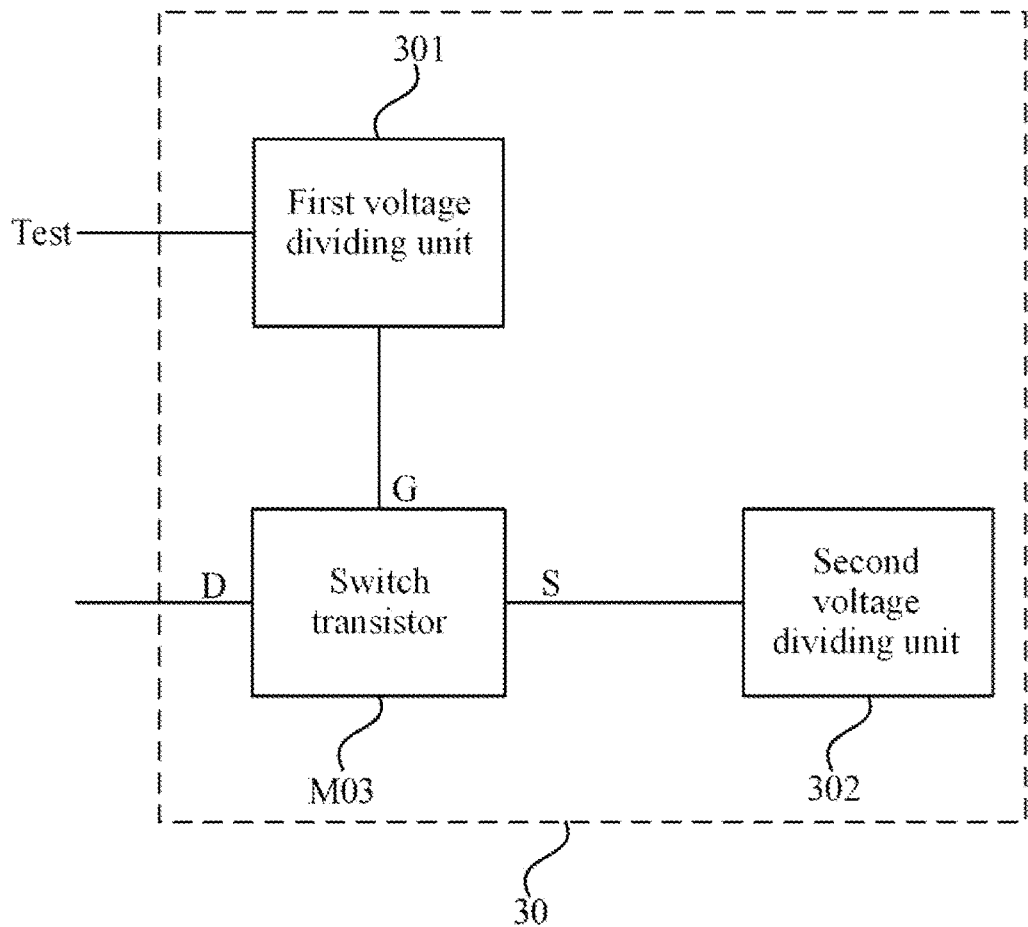
FIG. 4 is a schematic diagram illustrating the structure of another waterproof detection circuit according to an embodiment of the present utility model.

FIG. 4 is a schematic diagram illustrating the structure of another waterproof detection circuit according to an embodiment of the present utility model. With reference to FIG. 4, optionally, the switch module 30 includes a switch transistor M03, a first voltage dividing unit 301, and a second voltage dividing unit 302; a first electrode D of the switch transistor M03 is used as the first terminal of the switch module 30, a control terminal of the switch transistor M03 is connected to a first terminal of the first voltage dividing unit 301, a second terminal of the first voltage dividing unit 301 is used as the second terminal of the switch module 30, a second electrode S of the switch transistor M03 is connected to a first terminal of the second voltage dividing unit 302, and a second terminal of the second voltage dividing unit 302 is used as the third terminal of the switch module 30.

Figure 5:
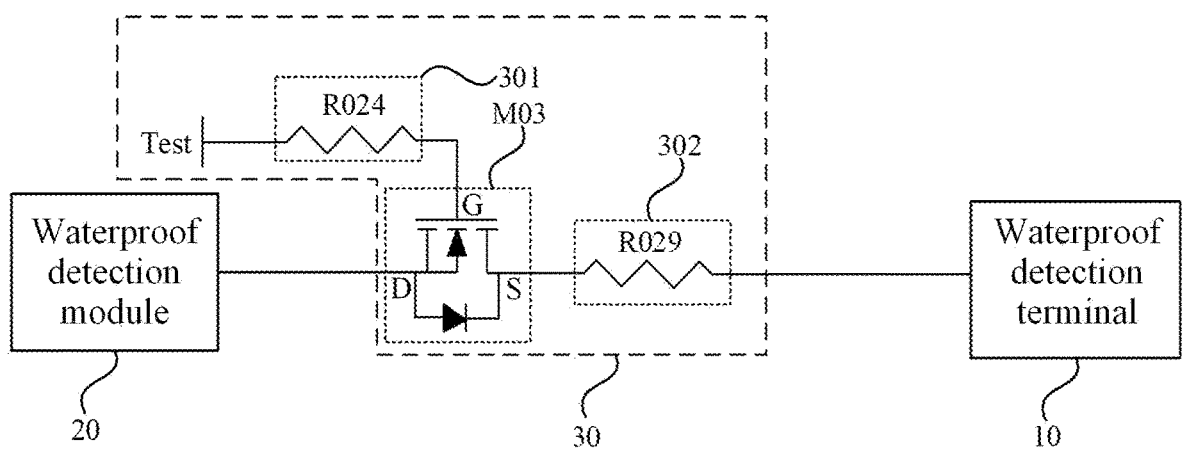
FIG. 5 is a schematic diagram illustrating the structure of another waterproof detection circuit according to an embodiment of the present utility model.
Figure 6:
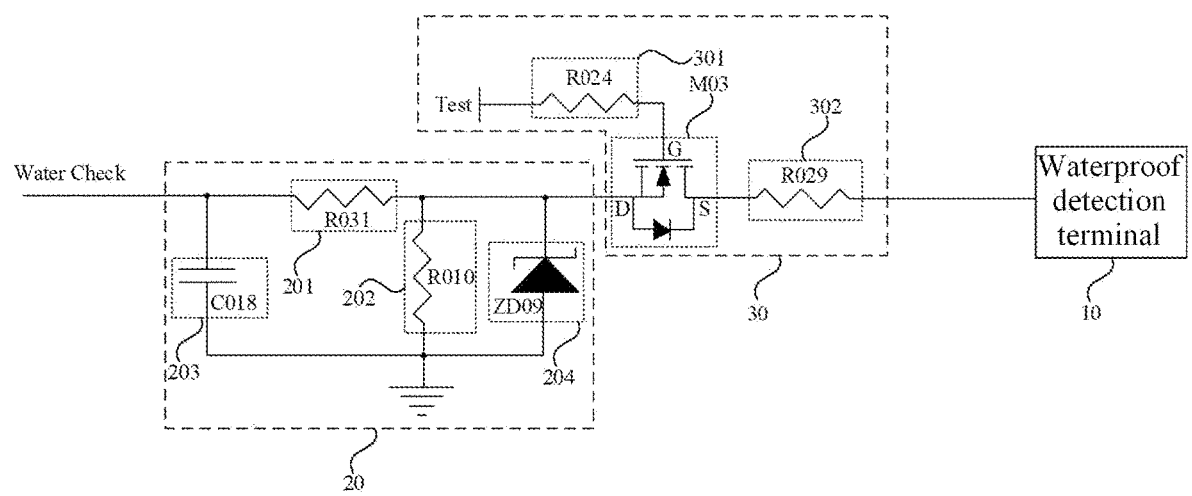
FIG. 6 is a schematic diagram of a waterproof detection circuit according to an embodiment of the present utility model.

FIG. 5 is a schematic diagram illustrating the structure of another waterproof detection circuit according to an embodiment of the present utility model. FIG. 6 is a schematic diagram of a waterproof detection circuit according to an embodiment of the present utility model. With reference to FIGS. 5 and 6, optionally, the first voltage dividing unit 301 includes a third resistor R024, a first terminal of the third resistor R024 is connected to the control terminal G of the switch transistor M03, and a second terminal of the third resistor R024 is used as the second terminal of the switch module 30; the second voltage dividing unit 302 includes a fourth resistor R209, a second terminal of the fourth resistor R209 is used as the third terminal of the switch module 30 and connected to the waterproof detection terminal 10, and a first terminal of the fourth resistor R209 is connected to the second electrode of the switch transistor M03.

Specifically, the second electrode S of the switch transistor M03 may be a source, and the first electrode D of the switch transistor M03 may be a drain. When the battery pack is dropped into water, and the impedance of the positive terminal of the battery and the negative terminal of the battery pack changes, the microcontroller of the battery pack in a dormant state is activated, and the switch transistor M03 in the switch module 30 is first turned on to connect the waterproof detection module 20 and the waterproof detection terminal 10. If it is detected that water exists outside, the microcontroller of the battery pack controls the switch transistor M03 in the switch module 30 to be turned off, disconnecting the waterproof detection module 20 from the waterproof detection terminal 10. Therefore, the battery pack does not leak electricity or electrolyze water due to outside water. When the battery pack is activated next time (that is, falls into water again), the microcontroller of the battery pack turns on the switch transistor M03 in the switch module 30 again to communicate the waterproof detection module 20 with the waterproof detection terminal 10. When water is detected, the discharge MOS is not allowed to be turned on, and the connection of the waterproof detection module 20 to the waterproof detection terminal 10 is disconnected via the switch transistor M03 in the switch module 30. Therefore, the battery pack is thrown into water several times and protected each time.

Optionally, the switch transistor includes at least one of power devices of MOSFET, IGBT, SCR, SiC, or GaN.

An embodiment of the present utility model also provides a battery pack. The battery pack includes the waterproof detection circuit provided by any embodiment of the present utility model, a positive terminal, a negative terminal, a microcontroller, a charge MOS, and a discharge MOS.

Since the battery pack includes the waterproof detection circuit provided in any embodiment of the present utility model, the preceding battery pack has the same beneficial effect as the waterproof detection circuit, and details are not described herein.

Optionally, the microcontroller includes at least one of a single-chip microcomputer, an MCU, or an FPGA.

The preceding embodiments do not limit the scope of the present utility model. It is to be understood by those skilled in the art that various modifications, combinations, sub-combinations, and substitutions may be performed according to design requirements and other factors. Modifications, equivalent substitutions, and improvements within the spirit and principle of the present utility model fall within the scope of the present utility model.

What is claimed is:

1. A waterproof detection circuit, applied to a battery pack, comprising a waterproof detection terminal, a waterproof detection module, and a switch module; wherein a detection terminal of a microcontroller of the battery pack is connected to a first terminal of the waterproof detection module, a second terminal of the waterproof detection module is connected to a first terminal of the switch module, a control terminal of the microcontroller of the battery pack is connected to a second terminal of the switch module, and a third terminal of the switch module is connected to the waterproof detection terminal;

a positive terminal of the battery pack is connected to a first terminal of the microcontroller of the battery pack, a negative terminal of the battery pack is connected to a second terminal of the microcontroller of the battery pack, and the microcontroller of the battery pack is activated and controls the switch module to be conducted in response to an impedance change of the positive terminal of the battery pack and the negative terminal of the battery pack; and the microcontroller of the battery pack is used for controlling the switch module, a charge Metal Oxide Semiconductor (MOS) of the battery pack, and a discharge MOS of the battery pack to be turned off when the positive terminal of the battery pack and the waterproof detection terminal satisfy a preset condition.

2. The circuit of claim 1, wherein the preset condition comprises at least one of voltage, current, or resistance variation.

3. The circuit of claim 1, wherein the waterproof detection module comprises a first current limiting unit, a second current limiting unit, a filtering unit, and a voltage stabilizing unit, wherein
a first terminal of the first current limiting unit is used as the first terminal of the waterproof detection module, a second terminal of the first current limiting unit is connected to a first terminal of the second current limiting unit, a first terminal of the filtering unit is connected to the first terminal of the first current limiting unit, a second terminal of the filtering unit is connected to a second terminal of the second current limiting unit and then grounded, a first terminal of the voltage stabilizing unit is connected to the first terminal of the second current limiting unit, a second terminal of the voltage stabilizing unit is connected to the second terminal of the second current limiting unit and then grounded, and the first terminal of the voltage stabilizing unit is used as the second terminal of the waterproof detection module.

4. The circuit of claim 3, wherein the first current limiting unit comprises a first resistor, and a first terminal of the first resistor is used as the first terminal of the waterproof detection module; and the second current limiting unit comprises a second resistor, a second terminal of the second resistor is grounded, and a second terminal of the first resistor is connected to a first terminal of the second resistor.

5. The circuit of claim 3, wherein the filtering unit comprises a first capacitor, a first terminal of the first capacitor is connected to the first terminal of the first current limiting unit, and a second terminal of the first capacitor is connected to the second terminal of the second current limiting unit; and the voltage stabilizing unit comprises a first diode connected between the first terminal of the second current limiting unit and the second terminal of the second current limiting unit.

6. The circuit of claim 1, wherein the switch module comprises a switch transistor, a first voltage dividing unit, and a second voltage dividing unit, wherein
a first electrode of the switch transistor is used as the first terminal of the switch module, a control terminal of the switch transistor is connected to a first terminal of the first voltage dividing unit, a second terminal of the first voltage dividing unit is used as the second terminal of the switch module, a second electrode of the switch transistor is connected to a first terminal of the second voltage dividing unit, and a second terminal of the second voltage dividing unit is used as the third terminal of the switch module.

7. The circuit of claim 6, wherein the first voltage dividing unit comprises a third resistor, a first terminal of the third resistor is connected to the control terminal of the switch transistor, and a second terminal of the third resistor is used as the second terminal of the switch module; and the second voltage dividing unit comprises a fourth resistor, a second terminal of the fourth resistor is used as the third terminal of the switch module and connected to the waterproof detection terminal, and a first terminal of the fourth resistor is connected to the second electrode of the switch transistor.

8. The circuit of claim 6, wherein the switch transistor comprises at least one of power devices of MOS Field Effect Transistor (MOSFET), an Insulate-Gate Bipolar Transistor (IGBT), a Silicon Controlled Rectifier (SCR), a Silicon Carbide (SiC), or a Gallium Nitride (GaN).

9. A battery pack, comprising a waterproof detection circuit, a positive terminal, a negative terminal, a microcontroller, a charge Metal Oxide Semiconductor (MOS), and a discharge MOS, wherein the waterproof detection circuit comprises a waterproof detection terminal, a waterproof detection module, and a switch module; wherein
a detection terminal of the microcontroller of the battery pack is connected to a first terminal of the waterproof detection module, a second terminal of the waterproof detection module is connected to a first terminal of the switch module, a control terminal of the microcontroller of the battery pack is connected to a second terminal of the switch module, and a third terminal of the switch module is connected to the waterproof detection terminal;
the positive terminal of the battery pack is connected to a first terminal of the microcontroller of the battery pack, the negative terminal of the battery pack is connected to a second terminal of the microcontroller of the battery pack, and the microcontroller of the battery pack is activated and controls the switch module to be conducted in response to an impedance change of the positive terminal of the battery pack and the negative terminal of the battery pack; and
the microcontroller of the battery pack is used for controlling the switch module, the charge MOS of the battery pack, and the discharge MOS of the battery pack to be turned off when the positive terminal of the battery pack and the waterproof detection terminal satisfy a preset condition.

10. The battery pack of claim 9, wherein the preset condition comprises at least one of voltage, current, or resistance variation.

11. The battery pack of claim 9, wherein the waterproof detection module comprises a first current limiting unit, a second current limiting unit, a filtering unit, and a voltage stabilizing unit, wherein
a first terminal of the first current limiting unit is used as the first terminal of the waterproof detection module, a second terminal of the first current limiting unit is connected to a first terminal of the second current limiting unit, a first terminal of the filtering unit is connected to the first terminal of the first current limiting unit, a second terminal of the filtering unit is connected to a second terminal of the second current limiting unit and then grounded, a first terminal of the voltage stabilizing unit is connected to the first terminal of the second current limiting unit, a second terminal of the voltage stabilizing unit is connected to the second terminal of the second current limiting unit and then grounded, and the first terminal of the voltage stabilizing unit is used as the second terminal of the waterproof detection module.

12. The battery pack of claim 11, wherein the first current limiting unit comprises a first resistor, and a first terminal of the first resistor is used as the first terminal of the waterproof detection module; and the second current limiting unit comprises a second resistor, a second terminal of the second resistor is grounded, and a second terminal of the first resistor is connected to a first terminal of the second resistor.

13. The battery pack of claim 11, wherein the filtering unit comprises a first capacitor, a first terminal of the first capacitor is connected to the first terminal of the first current limiting unit, and a second terminal of the first capacitor is connected to the second terminal of the second current limiting unit; and the voltage stabilizing unit comprises a first diode connected between the first terminal of the second current limiting unit and the second terminal of the second current limiting unit.

14. The battery pack of claim 9, wherein the switch module comprises a switch transistor, a first voltage dividing unit, and a second voltage dividing unit, wherein a first electrode of the switch transistor is used as the first terminal of the switch module, a control terminal of the switch transistor is connected to a first terminal of the first voltage dividing unit, a second terminal of the first voltage dividing unit is used as the second terminal of the switch module, a second electrode of the switch transistor is connected to a first terminal of the second voltage dividing unit, and a second terminal of the second voltage dividing unit is used as the third terminal of the switch module.

15. The battery pack of claim 14, wherein the first voltage dividing unit comprises a third resistor, a first terminal of the third resistor is connected to the control terminal of the switch transistor, and a second terminal of the third resistor is used as the second terminal of the switch module; and the second voltage dividing unit comprises a fourth resistor, a second terminal of the fourth resistor is used as the third terminal of the switch module and connected to the waterproof detection terminal, and a first terminal of the fourth resistor is connected to the second electrode of the switch transistor.

16. The battery pack of claim 14, wherein the switch transistor comprises at least one of power devices of MOS Field Effect Transistor (MOSFET), an Insulate-Gate Bipolar Transistor (IGBT), a Silicon Controlled Rectifier (SCR), a Silicon Carbide (SiC), or a Gallium Nitride (GaN).

17. The battery pack of claim 9, wherein the microcontroller comprises at least one of a single-chip microcomputer, a Microcontroller Unit (MCU), or a Field Programmable Gate Array (FPGA).

* * * * *